(12) United States Patent
Kishida

(10) Patent No.: US 7,057,365 B2
(45) Date of Patent: Jun. 6, 2006

(54) PROBER AND TESTING APPARATUS USING SAME

(75) Inventor: Akito Kishida, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/197,892

(22) Filed: Aug. 5, 2005

(65) Prior Publication Data

US 2006/0038525 A1 Feb. 23, 2006

(30) Foreign Application Priority Data

Aug. 20, 2004 (JP) ............................. 2004-240720

(51) Int. Cl.
*G01R 31/00* (2006.01)

(52) U.S. Cl. ...................... 318/490; 318/649; 324/755; 324/770

(58) Field of Classification Search ................ 318/490, 318/649; 324/537, 754, 755, 770; 702/108, 702/117, 118
See application file for complete search history.

(56) References Cited

U.S. PATENT DOCUMENTS

| | | | |
|---|---|---|---|
| 5,266,894 A * | 11/1993 | Takagi et al. | 324/765 |
| 6,208,571 B1 * | 3/2001 | Ikeda et al. | 365/201 |
| 6,714,888 B1 * | 3/2004 | Mori et al. | 702/120 |
| 6,857,093 B1 * | 2/2005 | Ooishi | 714/733 |

FOREIGN PATENT DOCUMENTS

JP 2001-296547 10/2001

* cited by examiner

*Primary Examiner*—Bentsu Ro

(57) ABSTRACT

A prober includes a frame having a frame ground terminal, a chuck stage, servo motors for driving the chuck stage, servo amplifiers connected to the servo motors, first floating mounts on which the servo amplifiers are provided, a second floating mount on which the servo motor is provided. The first floating mounts are electrically insulated from the frame and have first ground terminals connected to the ground terminals of the servo amplifiers. The second floating mount is electrically insulated from the frame and has a second ground terminal connected to the ground terminal of the servo motor. The prober further includes shielded cables connecting the servo amplifiers and the servo motors, a first wire connecting the first ground terminal and the frame ground terminal and also connecting the first ground terminal and the second floating mount, and second wires connecting the shielded cables and the frame ground terminal.

15 Claims, 5 Drawing Sheets

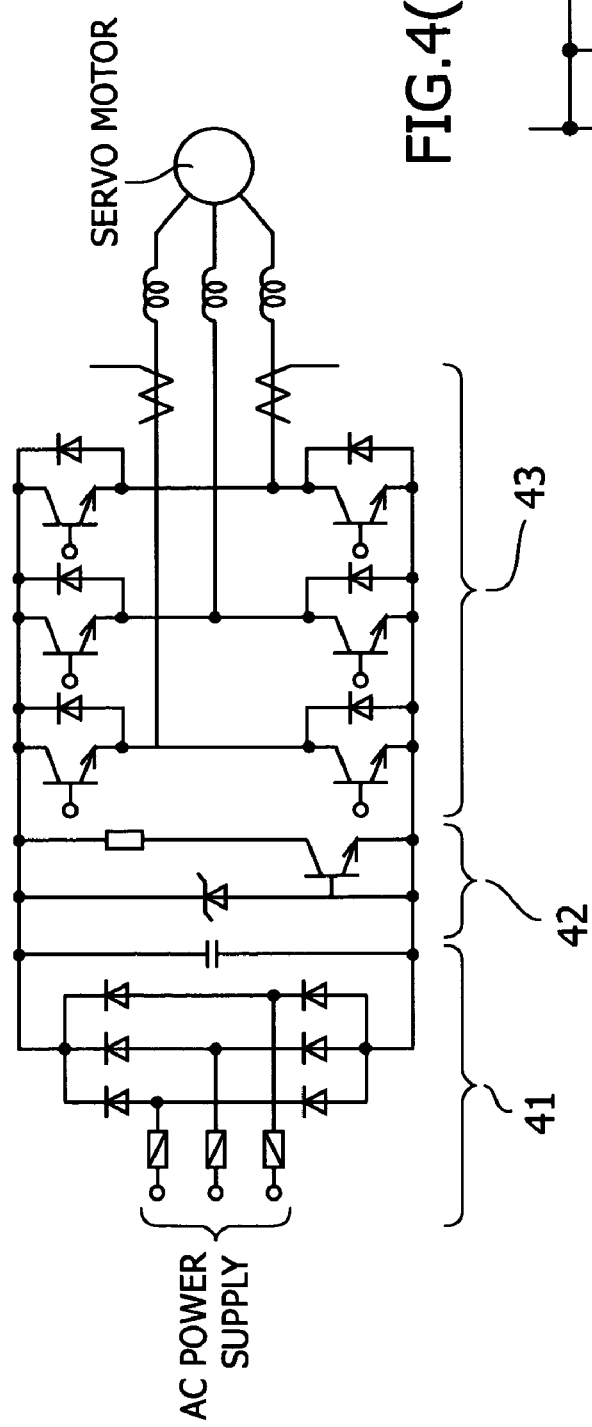
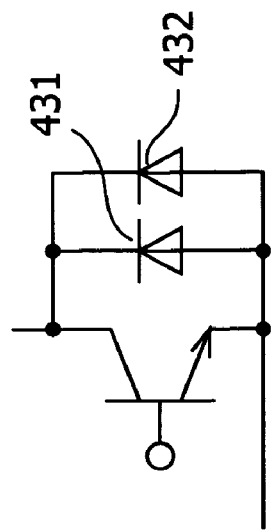
FIG.4(A) (RELATED ART)
FIG.4(B)

PROBER AND TESTING APPARATUS USING SAME

BACKGROUND OF THE INVENTION

1. Field of the Invention

The present invention relates to a prober used for testing devices and to a testing apparatus using the prober.

2. Description of the Related Art

In typical manufacturing lines, in order to evaluate the electrical performance of devices under test (hereinafter referred to as "DUTs"), such as semiconductor devices and display panels, an apparatus called a prober for transporting and moving the DUTs to a measurement position is used together with a tester. Such a prober has a mechanism capable of moving along four axes, namely, three axes in x, y, and z directions and a rotational θ axis, to appropriately perform the transportation of the DUTs and their movement to the measurement position.

Conventionally, many commercially available probers have been designed to have positional accuracy on the order of microns or micro meters. However, with the miniaturization of semiconductors in recent years, the demand has arisen for probers having positional accuracy on the order of sub-micron. Thus, components using feedback control, which are referred to as "servo motors" or "servo amplifiers", are now used.

In general, two types of servo motors, namely, AC (alternating current) and DC (direct current) motors, are available. AC servo motors that operate at a high speed, that do not produce dust due to a commutator and brushes, and that do not require less maintenance are mainly used for use semiconductor factories. After a low-AC-voltage power supply is converted into DC, silicon-controlled rectifiers, MOSFETs (metal-oxide semiconductor field-effect transistors), or IGBTs (insulated gate bipolar transistors) are used to switch three-phase high-frequency PWM (pulse-width modulated) inverters at several hundred Hz to several tens of kHz, and resulting outputs from the inverters are used to drive those servo motors.

That is, power converted from three-phase AC power supply into DC and converted back into AC is used for driving the AC servo motors. Since the re-conversion from DC into AC is performed using the inverters, relatively large noise may be generated. Such noise may affect the accuracy of measurements (voltage/current/resistance/charge) of a DUT placed on the chuck stage of the prober.

In a prober whose probe pins are brought into contact with a DUT in order to evaluate its performance, a relatively large current is used to produce high voltages in the prober so as to drive the motors. Thus, the influence of noise generated from the switching devices is considerable, and the performance of a measuring apparatus cannot be fully utilized.

For the measurement of semiconductor devices, with the miniaturization of semiconductors in recent years, a need has arisen for a measuring apparatus using currents on the order of femto-amperes and voltages on the order of microvolts. In addition, for the measurement of flat-panel displays (FPDs), micro-charge measurement for measuring electrical charges held in storage capacitors that typically have a capacitance of 1 pF or less are required as well as high-speed measurements for an enormous number of pixels, typically exceeding 100,000.

Since display panels, such as conventional LCD (liquid crystal display) panels or organic EL (electroluminescent) panels, are fabricated by growing silicon on insulator glass, display-panel probers used for testing the display panels are designed to be suitable for SOI (silicon-on-insulation) structures in principle. Thus, there is no need to apply a potential to the insulator glass and, in essence, the ground potential is considered sufficient for the chuck potential. As a result, no particular consideration is given to the influence of noise on the measurement and thus no special provision is made for the chuck and its shield structure, as shown in FIG. 8 in Japanese Unexamined Patent Application Publication No. 2001-296547.

Recently, however, large glass substrates are mainly used in order to reduce the cost for display panels, thus necessitating consideration of the influence of the substrate size. For example, since fifth-generation large one-meter-square substrates are used in an amorphous silicon process, the operating range of the chuck stage requires a square area with 3 meters on each side. When such a large area is completely enclosed for shielding, the manufacturing cost is increased.

Known probers use their frame as a reference surface for the potential of the power supply, the servo amplifiers, and the servo motors and also as ground and a return path for a return current. In typical probers, because of the cost, shielded cables are not used for the power lines from the servo amplifiers to the motors. Also, no prober is available that uses shield cables whose braided portions are 360-degree shielded to eliminate the leakage of electromagnetic fields (e.g., cables surrounded by a grounded metal film along the longitudinal direction) for the cable extraction portions of the servo-motor housings. In this manner, since it is difficult to ensure shielding for known probers, high-frequency AC and DC signals, which are the main noise components, may be fed back to the servo amplifiers through the frame of the prober.

In addition, the increased size of the substrates also necessitates the consideration of the influence of the increased size of the chuck. When an insulator is interposed between the chuck and the ground, a stray capacitance (earth capacitance) C relative to the area S of the chuck is expressed by:

$$C = \in r \cdot (S/d)$$

where $\in r$ indicates the dielectric constant of material of the insulator and d indicates the distance between the chuck and the ground.

Seventh-generation glass substrates have a size of about two meters on each side, that is, twice the size of the fifth generation substrates in terms of side length and four times as large as the fifth generation in terms of stray capacitance. As a result, paths through which noise is introduced into the chuck are easily formed. This means that the measuring apparatus for testing becomes more susceptible to influence from other path components.

In addition, since the display panel to be tested weighs more than a semiconductor wafer, a chuck-stage driving motor that uses a larger driving current is employed for the display-panel prober than for a semiconductor-device prober. Consequently, the display-panel prober generates a larger amount of noise than the semiconductor-device prober.

Accordingly, in order to achieve high-speed measurements of micro currents and micro charges, there is a need for a prober that suffers smaller influence on measurements from noise on the measurement.

SUMMARY OF THE INVENTION

The present invention is to reduce the influence of noise on DUT measurements.

The present invention provides a prober having a stable ground configuration in which the frame of the prober and electrical components are insulated from each other, and DC-component potentials of the electrical components are grounded to one frame ground terminal.

More specifically, one aspect of the present invention provides a prober including a frame having a frame ground terminal; a chuck stage for placing a device under test; at least one servo motor for driving the chuck stage, each servo motor having a ground terminal; and at least one servo amplifier connected to the servo motor, each servo amplifier having a ground terminal. The prober further includes at least one first floating mount on which the servo amplifier is provided, the first floating mount being electrically insulated from the frame and being provided with a first ground terminal that is connected to the ground terminal of the servo amplifier; at least one second floating mount on which at least one of the at least one servo motor is provided, each second floating mount being electrically insulated from the frame and being provided with a second ground terminal that is connected to the ground terminal of each of the at least one servo motor; a shielded cable that connects the servo amplifier and the servo motor; a first wire that connects the first ground terminal and the frame ground terminal and that connects the first ground terminal and the second floating mount; and a second wire that connects the shielded cable and the frame ground terminal.

Another aspect of the present invention provides a prober including a frame having a frame ground terminal; a chuck stage for placing a device under test; at least one servo motor for driving the chuck stage, each servo motor having a ground terminal and a shaft with a first insulating member; and at least one servo amplifier connected to the servo motor, each servo amplifier having a ground terminal. The prober further includes at least one first floating mount on which the at least one servo amplifier is provided, the first floating mount being electrically insulated from the frame and being provided with a first ground terminal that is connected to the ground terminal of the servo amplifier; at least one second floating mount on which at least one of the at least one servo motor is provided, each second floating mount being electrically insulated from the frame and being provided with a second ground terminal that is connected to the ground terminal of each of the at least one servo motor; a shielded cable that connects the servo amplifier and the servo motor; a first wire that connects the first ground terminal and the frame ground terminal and that connects the second floating mount and the frame ground terminal; and a second wire that connects the shielded cable and the frame ground terminal.

Preferably, the prober further includes an output filter for the at least one servo amplifier, the output filter being provided between the servo amplifier and the servo motor; and a metal connector provided for connection by the shielded cable between the servo amplifier and the servo motor, a shell of each metal connector being connected to a shield of the shielded cable.

Preferably, each metal connector is achieved by the shield or a braided line of each shielded cable, the shield or the braided line surrounding the shielded cable so as to provide 360-degree shielding in a circumferential direction.

Preferably, the prober further includes an input filter for the servo amplifier, a second shielded cable that connects the servo amplifier and the corresponding input filter, and a third wire that connects the second shielded cable and the frame ground terminal.

Preferably, at least one of the at least one servo amplifier includes a power-factor correction circuit having a silicon carbide diode. The prober may further include a fourth wire that connects the frame ground terminal and a ground terminal of a test-head housing. Preferably, a distance between a surface of the chuck stage and a portion through which noise of the prober flows, the portion being adjacent to the surface of the chuck stage, is five centimeters or more. The portion through which the noise of the prober flows may include at least one of the shielded cable, housing of the servo motor, a shaft of the servo motor up to the first insulating member, and the servo amplifier.

Preferably, the prober further includes a support member for supporting the chuck stage and a support table for supporting the support member. A shaft of at least one the servo motor may be connected to another extension shaft with a second insulating member provided therebetween, and a metal portion of the shaft, the support member, and the support table may be connected to the frame ground terminal. Preferably, the one of the at least one servo motor is a motor to which the greatest load is applied. The servo amplifier may include a switching device having a flywheel diode with which a silicon carbide diode is connected in parallel. The servo amplifiers may include a switching device having a silicon carbide diode.

A still another aspect of the present invention provides a testing apparatus including the prober described above.

While a case in which the DUT is a display panel will be mainly described herein, the present invention is not limited to such embodiment and is also applicable to the evaluation of characteristics of semiconductor devices or the like.

According to the prober and testing apparatus of the present invention, since wiring is provided so as to reduce the influence of noise on the chuck stage for placing the DUT, high-accuracy and high-speed measurement can be performed with reduced influence of noise, even if the measurement system is equipped and used with the prober. Moreover, noise generated from the servo motors and servo amplifiers is reduced, which further contributes to improved accuracy and a higher speed of measurement.

BRIEF DESCRIPTION OF THE DRAWINGS

FIG. 4A is a circuit block diagram of a known typical AC servo amplifier including flywheel diodes (FWDs);

FIG. 4B is a block diagram of a circuit in which silicon carbide (SiC) diodes are connected in parallel with the flywheel diodes, which are connected in parallel with transistors (or IGBT devices) included in an inverter section shown in FIG. 4A.

DESCRIPTION OF THE PREFERRED EMBODIMENT

Figure 1:
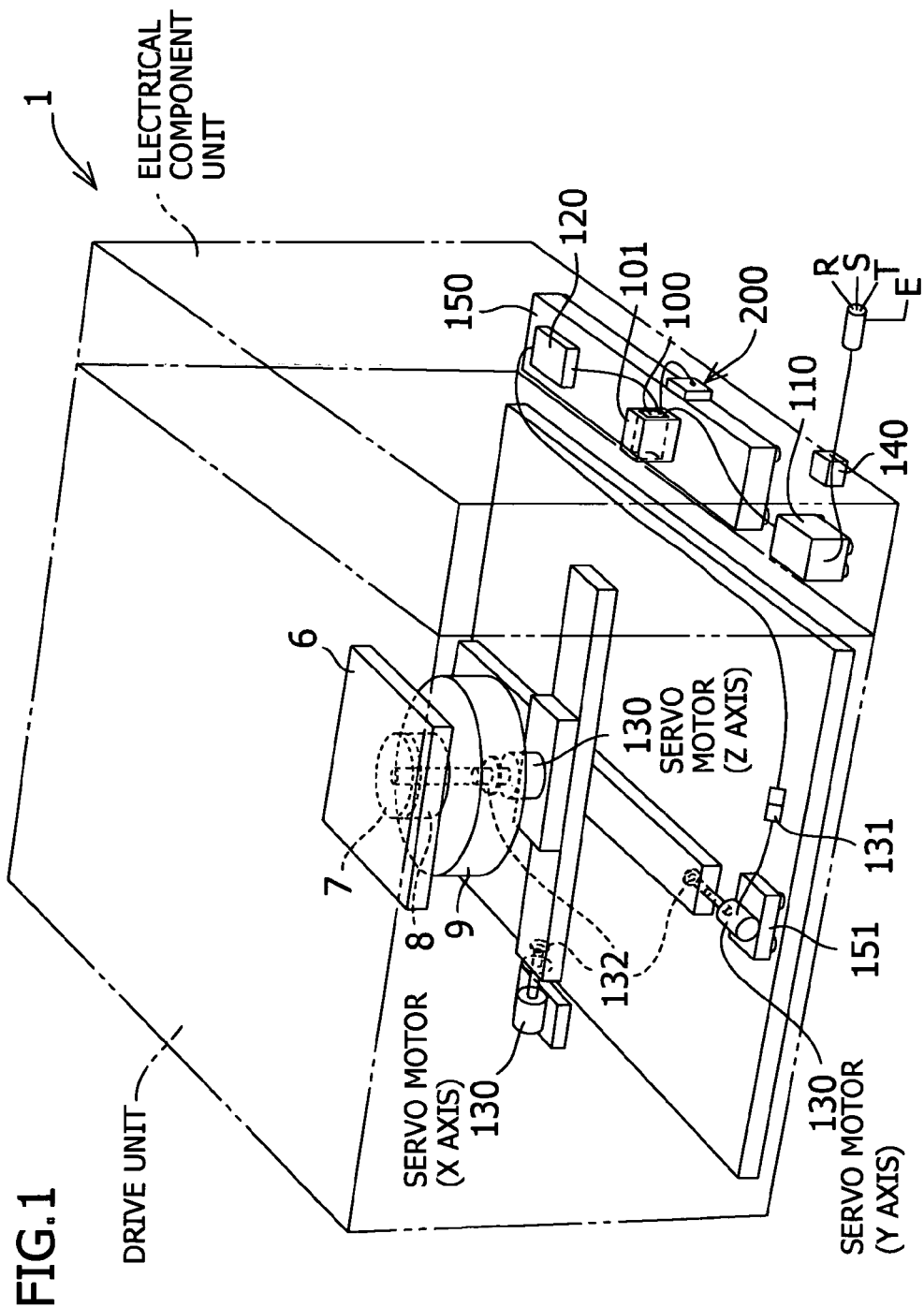
FIG. 1 is a perspective view of a prober of an embodiment of the present invention.

A display-panel prober according to the present invention will be described below with reference to FIGS. 1 to 3. A prober of the present invention described below by way of example is designed for display panels. It should be noted, however, that the present invention is not only applicable to probers for display panels but is also applicable to other apparatuses, such as semiconductor devices.

A schematic configuration of a display-panel prober of the present invention will now be described with reference to FIG. 1. FIG. 1 is a perspective view of a display-panel prober 1 of the present invention. This display-panel prober 1 includes a drive unit for moving a device under test (DUT) for measurements and an electrical-component unit for supplying power to the drive unit.

The drive unit of the prober 1 includes a chuck stage 6 for placing a DUT, a support member 8 for supporting the chuck stage 6 with an insulating member 7 therebetween, a support table 9 for supporting the support member 8, x-, y-, and z-axis servo motors 130 for moving the support table 9, and at least one floating mount 151 that is insulated from the frame of the prober 1. At least one of the servo motors 130 is placed on the corresponding floating mount 151.

The electrical-component unit of the prober 1 includes breakers 140 for receiving input AC (alternating current) power supply, input filters 110 connected to the corresponding breakers 140, servo amplifiers 100 connected to the corresponding input filters 110, output filters 120 connected to the corresponding servo amplifiers 100, metal shield boxes 101 that enclose the servo amplifiers 100, and at least one floating mount 150 insulated from the frame of the prober 1. The servo amplifiers 100, the shield boxes 101, and the output filters 120 are placed on the floating mount(s) 150.

Wiring between the individual electrical components will be described later with reference to FIGS. 2 and 3.

Referring now to FIG. 1, a rail is provided below the z-axis servo motor 130 for moving the support table 9 in a vertical direction and is connected to the x-axis servo motor 130 for moving the chuck stage 6 in a horizontal direction. Further, another rail is provided below the rail connected to the x-axis servo motor 130 and is connected to the y-axis servo motor 130 for moving the support table 9 in a horizontal direction that is different from the x-axis direction. The x-, y-, and z-axis servo motors 130 are connected to respective shafts via respective insulating members 132. Thus, the support table 9 moves in a predetermined direction because of the motion of the shafts. Further, a θ-axis servo motor (not shown) for rotating the chuck stage 6 is directly connected to the chuck stage 6.

Now, the result of analysis of noise generation factors in the prober 1 will be briefly described. From the result of inter-wiring/inter-wiring-housing measurement of each servo motor 130, the present inventor has discovered that a coupling capacitance of about several thousand pF is present between the windings and the housing of each servo motor 130. This result suggests the presence of, in addition to wire-induced noise, electrical current that leaks from the housing of each servo motor 130 and that flows thereto via the housing of the prober 1. That is, the current that flows via the housing of the prober 1 causes a fluctuation in the potential of the prober 1 and the fluctuation is transmitted to the chuck stage surface on which a DUT is placed. This appears to be responsible for measurement fluctuation, i.e., noise generation.

Accordingly, with the finding described above, the provision of a flowing path, i.e., a ground wire, so as to restrict the paths for the flowing current and minimize the radiation of electromagnetic energy makes it possible to effectively reduce the influence that the noise has on the measurement.

The above-noted noise can be classified into, mainly, the following three types. A first type of noise is introduced from another apparatus via a DC (direct current) line. A second type of noise is introduced by electrical housing vibration resulting from the flow of high-frequency noise, generated in the prober 1, via the housing of the prober 1. A third type of noise is caused by capacitive coupling that depends on the positional relationship between the chuck stage 6 and a portion through which the noise of the prober 1 flows.

As specific approaches for reducing the influence of such noise, the following five approaches are proposed in the present invention. In a first approach, return paths of current from the servo amplifier 100 and the servo motors 130 are restricted to reduce current that is fed back via the housing of the prober 1. In a second approach, the electrical components and the floating mounts, which are insulated from the housing of the prober 1, are connected so that they are grounded at one spot of the frame ground of the prober 1, thereby achieving reduced impedance. In a third approach, an appropriate distance is provided between the surface of the chuck stage 6 and a portion through which the noise of the prober 1 flows, thereby reducing stray capacitance between the chuck stage surface and the portion through which the noise flows. In a fourth approach, insulating members or insulating couplings are disposed between the servo motors and the shafts or chuck stage, which are connected to the servo motors, and metal portions following the insulating members or insulating couplings are grounded to prevent the metal portions from acting as antennas. That is, this arrangement suppresses the influence that the noise introduced from the servo motors has on the potential of the chuck stage 6. In a fifth approach, silicon carbide diodes (hereinafter referred to as "SiC diodes") are used to reduce noise generated by the servo amplifiers 100.

The positional relationship of the electrical components included in the display-panel prober 1 of the present invention and ground wiring between the electrical components will now be described with reference to FIG. 2.

Figure 2:
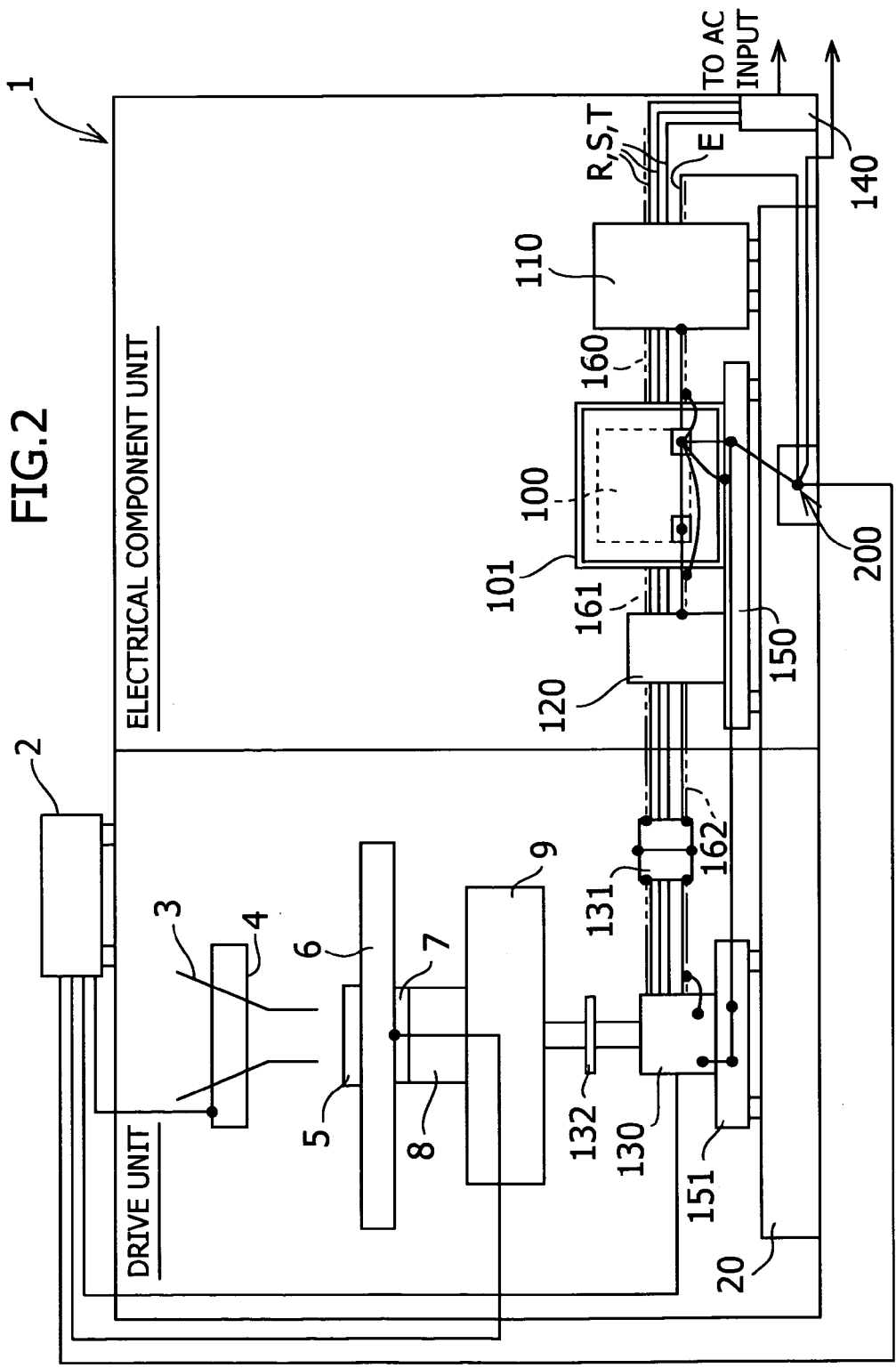
FIG. 2 is a schematic view showing members constituting the prober and wires therefor.
Figure 3:
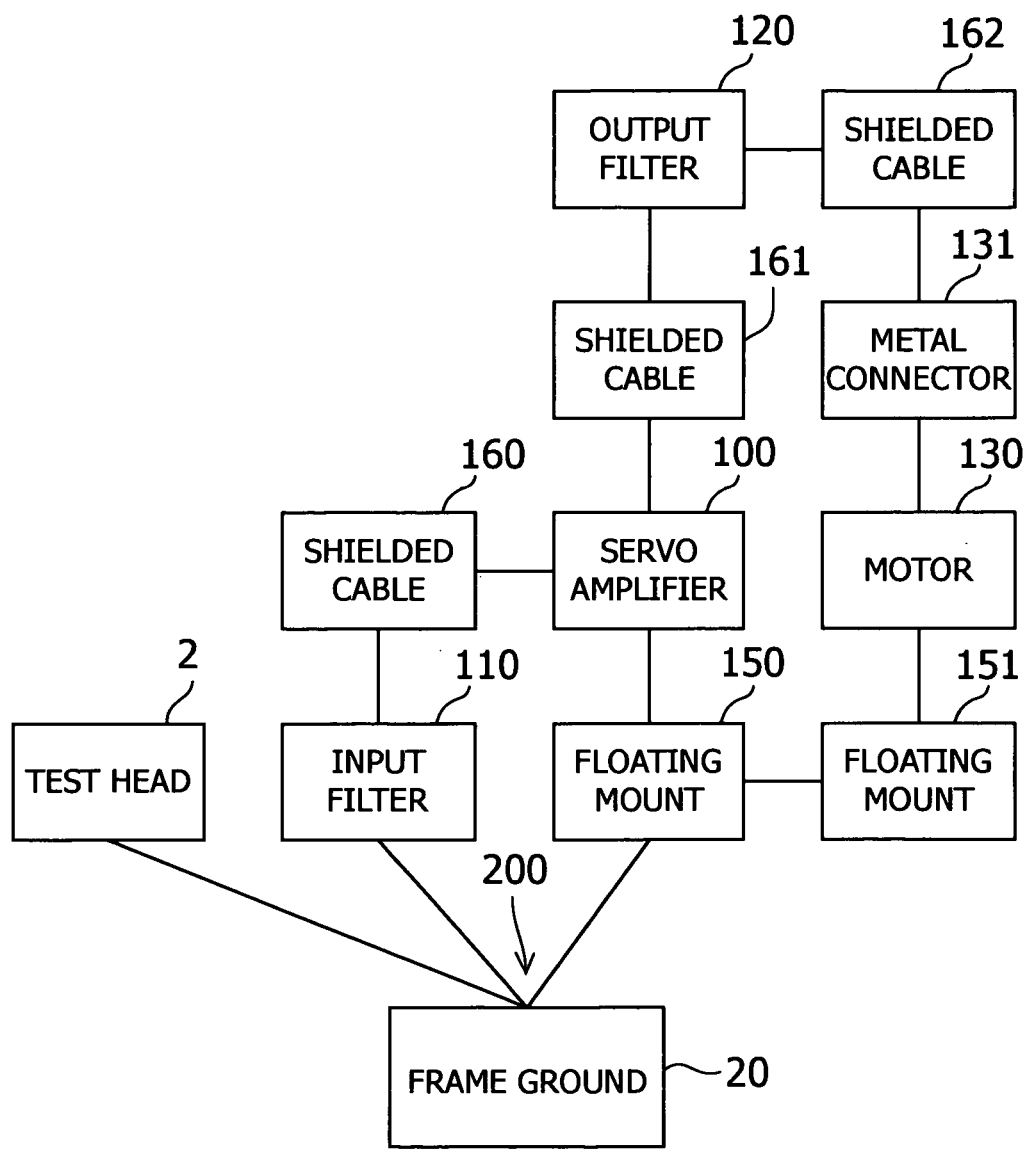
FIG. 3 is a system diagram showing the ground wiring of the prober.

In FIG. 2, for ease of understanding of the connections between the drive unit and the electrical-component unit, the prober 1 is shown with the direction of the electrical-component unit being changed. Further, for ease of description, one servo amplifier 100 and one servo motor 130 for each of the four axes x, y, z, and θ are shown in FIG. 2. In practice, however, it should be noted that four servo amplifiers 100 and four servo motors 130 are needed for driving along four axes x, y, z, and θ.

Connections in the vicinity of a frame ground terminal 200 will first be described with reference to FIG. 2. In FIG. 2, the frame ground terminal 200 is connected to a ground terminal of the housing of a tester or test head 2. This connection can easily be accomplished by, for example, obtaining power supply from a common power distribution board. With this arrangement, DC potentials between the prober 1 and the tester 2 are at the same level, thereby preventing the flow of stray current.

The frame ground terminal 200 is also connected to a terminal provided on the floating mount 150. The floating mounts 150 and 151 are insulated from a frame 20 of the prober 1. The reason why such floating mounts are provided is to prevent the electrical components (including cables and so on) of the prober 1 from improperly making contact with the housing of the prober 1. It is also desired that the floating mounts 150 and 151 be connected with a low inductance. In this respect, a flat-braided copper line is more suitable than a hook-up wire.

In addition, the frame ground terminal 200 in the prober 1 is connected to a ground line E coupled to a ground terminal (not shown) provided on the power distribution board.

Next, a description is given of connections between the terminals provided on the floating mounts 150 and 151 and the ground terminals of the electrical components disposed on the floating mounts 150 and 151.

The terminal provided on the floating mount 150 is connected to a ground terminal of the servo amplifier 100. The ground terminal of the servo amplifier 100 is, in turn, connected to a shielded cable 160 that couples the servo amplifier 100 and the input filter 110, to a shielded cable 161 that couples the servo amplifier 100 and the output filter 120, and to the shield box 101. The ground terminal of the servo amplifier 100 is further connected to the housing of the input filter 110 and the housing of the output filter 120.

The terminal provided on the floating mount 151 is also connected to the housing of each servo motor 130 via the floating mount 151. The housing of the servo motor 130 is, in turn, electrically connected to a metal connector 131 via a shielded cable 162. The metal connector 131 is connected to the shielded cable 162, which couples the output filter 120 and the servo motor 130.

Each of the shielded cables 160, 161, and 162 has therein a total of four lines, namely, three-phase DC power supply lines R, S, and T with AC inputs and a ground line E connected to the frame ground terminal 200.

A power cable extending from the servo motor 130 is shielded with the housing potential of the servo motor 130 and this shield provides a current return path. Thus, a stable potential with a low inductance can be delivered from the frame ground terminal 200 to the housing of the servo motor 130.

A shielded cable or a shielded cable having a conduit-pipe-based shield can be used as the power cable that couples the servo amplifier 100 and the servo motor 130. Further, 360-degree shielding can also be used for the power cable and/or an encoder line between the servo amplifier 100 and the servo motor 130.

In addition, the connector shell also requires 360-degree shielding using a metal connector or the like in order to prevent electrical discontinuity in the shielded connection of relay portions, such as a connector that couples cables. When 360-degree shielding is used, it is preferable that an insulator be provided on the outer side of the connector shell or the shield in order to prevent the connector shell or the shield from improperly making contact with the housing of the prober 1. It is also preferable that the above-described shielded cable be used for a control line for each electrical component.

Next, a description is given of accommodating the servo amplifier 100 and the servo motor 130 in corresponding shield boxes 101 to provide shielding. Referring to FIG. 2, in the prober 1 of the present invention, the servo amplifier 100 for driving the servo motor 130 is accommodated in the metal shield box 101, which is insulated from the housing of the prober 1. Similarly to the servo amplifier 100, the servo motor 130 can also be shielded with a shield box. In this case, the connection can be such that the ground of the shield box 101 and the ground of the corresponding servo amplifier 100 are interconnected and are further connected to the frame ground terminal 200.

For the servo amplifier 100, since the input and output wires are connected thereto, a shield box (called a "five-side shield box") in which openings are provided in surfaces from which the wires are extracted can also be used.

The ground terminal of the input filter 110, which is coupled to the servo amplifier 100, is connected to the terminal of the floating mount 150 via the ground terminal of the servo amplifier 100. Similarly to the floating mount 150, the input filter 110 is insulated from the frame 20. The housing of the input filter 110 is connected to the frame ground terminal 200.

The input filter 110 and the output filter 120 for the servo amplifier 100 have their maximum elimination effects, preferably, in the frequency range of 1 kHz to 100 kHz, and more preferably, up to about 3 to 5 MHz. It is also preferable that a common-mode filter device be provided in the vicinity of the servo amplifier 100 to reduce a voltage fluctuation occurred during the control of the servo amplifier 100. Additionally, it is preferable that the input filter 110 and the output filter 120 be positioned within 30 cm from the servo amplifier 100, which distance is sufficiently small and feasible, to reduce the influence of harmonics of the servo amplifier 100.

Next, the connections of the electrical components included in the prober 1 shown in FIG. 1 according to the present invention will be described with reference to FIG. 3. FIG. 3 is a schematic diagram showing the connections between the electrical components included in the prober 1 and the frame ground terminal 200 of the prober 1. As shown in FIG. 3, with regard to the relationship between the frame ground terminal 200 of the prober 1 and the ground terminals of the electrical components included in the prober 1, they are designed such that noise-flow paths form a closed circuit without going through the frame ground and are also connected in a radial pattern, or a star connection manner. In this manner, according to the prober 1 of the present invention, the electrical components included in the prober 1 are insulated from the frame 20 and connections to the electrical components are achieved from the frame ground terminal 200.

In this case, due to the influence of mutual inductance, AC noise components that are fed back from the servo motors 130 to the servo amplifiers 100 pass through the braided shields of the shielded cables 161 and 162. The reason is that the impedance of a path that goes through the braided shields of the shielded cables 161 and 162 is lower than the impedance of a path that goes through the housing of the prober 1. When the shielded cables 161 and 162 are used as described above, the AC components cancel each other out, since the directions of the upstream path and the downstream path are different from each other. Such an arrangement, therefore, offers an advantage in that a magnetic field radiated externally from the shielded cables is relatively small. This can also be true for the shielded cable 160 that couples the servo amplifier 100 and the input filer 110.

On the other hand, DC noise components and relatively low-frequency components are fed back through the frame 20 of the prober 1 rather than through the shielded cables 161 and 162. The reason is that the cable that couples the servo amplifier 100 and the servo motor 130 is long and has high resistance.

Since DC noise components that pass through the frame 20 do not form capacitive coupling that is great enough to affect the measurement of a DUT placed on the chuck stage 6, the influence on the DUT measurement should be significantly small.

As described above, according to the prober 1 of the present invention, the floating mounts 150 and 151 are used to insulate the electrical components, such as the servo motors 130 and the servo amplifiers 100, from the frame 20 and the shielded cables 160, 161, and 162 are used to provide wiring between the electrical components, so that the return path for AC noise components and the return path for DC noise components are isolated from each other. Thus, measures can be taken by individually considering the influence of each noise component on the measurement, thereby facilitating the analysis of noise-generating factors.

Although a configuration in which the floating mount 150 and the floating mount 151 are connected to each other has been described in the above description for the prober 1 of the present invention, the present invention is not limited thereto. For example, it should be noted that the configuration can be such that the insulating members (or insulating couplings) 132 are provided on the shafts that are connected to the servo motors 130 and the floating mount 151 is connected to the frame ground terminal 200 instead of connecting the floating mount 151 to the floating mount 150. The provision of such insulating members (or insulating couplings) 132 on the shafts can prevent noise current from flowing to the chuck stage 6 via the shafts.

In addition to the above-described embodiment of the present invention, a low-dielectric-constant material (e.g., a material with ∈ less than about 3) may be used between the chuck stage 6 and the frame ground terminal 200 to ensure a distance therebetween. Alternatively, a shield may be inserted into an insulating plate 7 interposed between the chuck stage 6 and the support table 9, which supports the chuck stage 6, and be connected to the frame ground terminal 200 of the prober 1. Such configurations can further reduce the influence of noise on the measurement. Also, the shaft of one of the servo motors may be connected to another extension shaft with an insulating member provided therebetween.

Additionally, it is preferable that the distance between the chuck stage 6 and the adjacent housing of the prober 1 be 5 cm or more. The reason is that, when the size of display panels and the above-noted expression C=∈r·(S/d) for the stray capacitance are considered, the stray capacitance in this case is at such a level that the influence on the DUT measurement is substantially negligible.

Measures for noise from the servo motors 130 will be described next. Since the prober 1 of the present invention needs to transport or move a DUT, the shafts that are connected to the x-axis and y-axis servo motors 130 may extend long. Such extensions may cause the shafts to act as antennas that emit noise from the servo motors 130. In order to reduce the noise emitted in that manner, for example, the insulating members 132 can be used for the junctions between the servo motors 130 and the corresponding shafts. Examples of the insulating couplings 132 are described, for example, on the web: http://www.mighty-corp.co.jp/seihin/mj/mjc.html. Therefore, there is a need to prevent the support member 8, the support table 9, and the metal portions of the shafts following the insulating couplings from acting as antennas, by electrically insulating those portions. Such an arrangement can prevent noise from the servo motors 130 from being emitted via the shafts. In this case, backlash-free insulating couplings are also available to maintain the mechanical positional accuracy.

Since the θ-axis servo motor 130 does not employ a spindle system, a planar insulating member, such as a plate-shaped insulating member, may be used therefor instead of the insulating coupling described above.

In some cases, the above-described insulating members may not be able to be attached to all the servo motors for driving the shafts in the x, y, z, and θ axes. In such cases, it is preferable that the insulating member(s) be attached to one or more of the motors having a relatively large load. One reason is that, when the y-axis motor 130 is located lowermost in the prober 1, a motor having a large driving capability is used for the y-axis motor 130, since it requires a driving capability that allows for the weight of three x-, z-, and θ-axis motors in addition to the weight of the chuck stage 6 and the support table 9. A further reason is that a motor having a larger driving capability commonly generates a larger amount of noise.

While a configuration for reducing the influence that the noise has on the measurement has been described above, suppression of the noise generation will be described next. Under the current situation, insulated gate bipolar transistors (IGBTs) are mainly used for switching elements in the servo amplifier 130. However, when the switching element is turned off, reverse recovery current di/dt of a flywheel diode (FWD) flows to a residual inductance portion L located on the wire, thereby generating a vibratory surge voltage L·di/dt. This vibratory surge voltage leads to noise.

FIG. 4A is a circuit diagram of a typical amplifier including flywheel diodes (FWDs). As shown in FIG. 4A, the typical amplifier includes a converter section 41, a regenerative-power absorbing section 42, and an inverter section 43. In the inverter section 43, diodes, which correspond to the FWDs described above, are connected in parallel with six transistors (or IGBT devices), respectively.

A description is now given of a configuration in which SiC diodes are connected in parallel with flywheel diodes for the IGBTs to reduce switching noise generated from the servo amplifier 130. First, a specific example therefor is illustrated in FIG. 4B. FIG. 4B shows a circuit configuration in which a SiC diode is connected in parallel with a flywheel diode (FWD) 431 connected in parallel with one transistor (or IGBT device) in the inverter section 43 of the typical servo amplifier shown in FIG. 4A.

Figure 5:
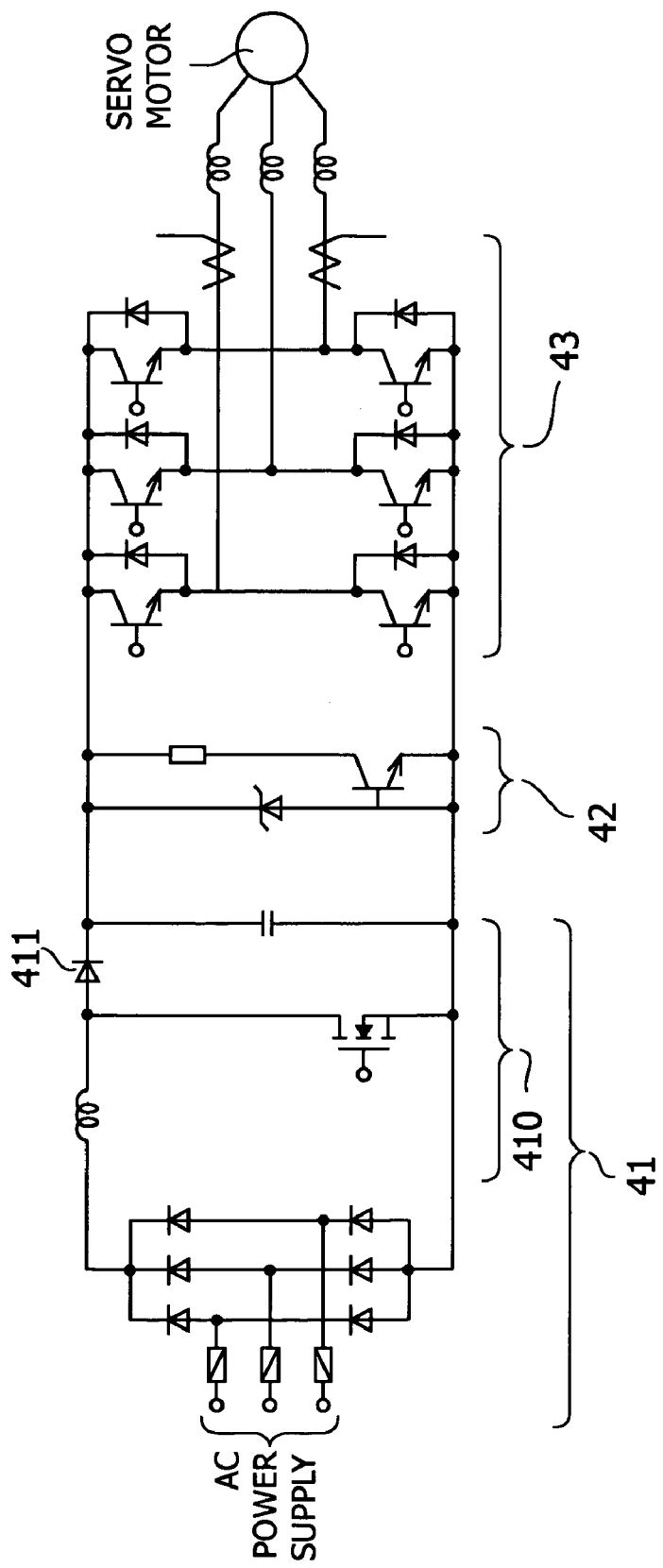
FIG. 5 is a block diagram of a circuit in which a SiC diode is used as a diode in an AC servo amplifier including a power-factor correction circuit.

Although the scheme in which the SiC diode is connected in parallel with the FWD 431 is illustrated in this case, the present invention is not limited thereto. For example, the FWD 431 may be replaced with a SiC diode. When a power-factor correction circuit 410 is provided in the converter section 43 of the servo amplifier circuit, as shown in FIG. 5, to improve the power factor, a SiC diode may be used as a diode 411 provided in the servo amplifier. This arrangement can reduce reverse recovery time (Trr) during the switching, thereby reducing noise generation. That is, as compared to a typical silicon diode, the recovery time can be reduced since the reverse recovery time is from about several tens of ns to several hundred ns or less. Consequently, the generation of electrical vibration noise components is reduced.

A silicon diode is built into a typical IGBT module. With such an IGBT module, a SiC diode may be added thereto in parallel using a short wire. This can provide a configuration that achieves the same advantages without the replacement. In this case, noise components generated in the first 20 to 100 ns are regenerated by the SiC diode and large-current components generated after 100 ns are taken care of by the built-in silicon diode.

The use of such a SiC diode can reduce noise generated during the switching, thus making it possible to provide a display-panel prober that exhibits low noise generation.

Lastly, the above-described approaches in the present invention will be summarized below. In the first approach, the return paths of current from the servo amplifiers and the servo motors are restricted, thereby suppressing a current path that goes through the prober housing. In the second approach, the electrical components and the floating mounts, which are insulated from the prober housing, are connected to ground at one spot in a radial pattern, thereby achieving low impedance. In the third approach, an appropriate distance is provided between the surface of the chuck stage and a portion through which the noise of the prober flows, thereby reducing stray capacitance between the chuck stage surface and the portion through which the noise of the prober flows. In the fourth approach, the insulating members are disposed between the servo motors and the shafts or chuck stage, which are connected to the servo motors, to thereby reduce the influence that the noise from the servo motors has on the potential of the chuck stage. In the fifth approach, the SiC diodes are used to thereby reduce noise generated from the servo amplifiers.

The above-described prober of the present invention reduces the generation of a vibratory surge voltage L·di/dt, which can cause noise, by reducing the amount of fluctuation in the residual inductance L and reverse recovery current di/dt. Accordingly, the prober can reduce the influence of noise and the noise itself, which adversely affect electrical measurement, thus making it possible to provide a prober and a testing apparatus which achieve high accuracy, high processing speed, and high reproducibility.

What is claimed is:

1. A prober comprising:
   a frame having a frame ground terminal;
   a chuck stage for placing a device under test;
   at least one servo motor for driving the chuck stage, each servo motor having a ground terminal;
   at least one servo amplifier connected to the servo motor, each servo amplifier having a ground terminal;
   at least one first floating mount on which the at least one servo amplifier is provided, the first floating mount being electrically insulated from the frame and being provided with a first ground terminal that is connected to the ground terminal of the servo amplifier;
   at least one second floating mount on which at least one of the at least one servo motor is provided, each second floating mount being electrically insulated from the frame and being provided with a second ground terminal that is connected to the ground terminal of each of the at least one servo motor;
   a shielded cable that connects the servo amplifier and the servo motor;
   a first wire that connects the first ground terminal and the frame ground terminal and that connects the first ground terminal and the second floating mount; and
   a second wire that connects the shielded cable and the frame ground terminal.

2. The prober according to claim 1, further comprising an output filter for the at least one servo amplifier, the output filter being provided between the servo amplifier and the servo motor; and a metal connector provided for connection by the shielded cable between the servo amplifier and the servo motor, a shell of each metal connector being connected to a shield of the shielded cable.

3. The prober according to claim 2, wherein each metal connector comprises the shield or a braided line of each shielded cable, the shield or the braided line surrounding the shielded cable so as to provide 360-degree shielding in a circumferential direction.

4. The prober according to one of claim 1, further comprising an input filter for the servo amplifier; a second shielded cable that connects the servo amplifier and the corresponding input filter; and a third wire that connects the second shielded cables and the frame ground terminal.

5. The prober according to one of claim 1, wherein at least one of the at least one servo amplifier comprises a power-factor correction circuit having a silicon carbide diode.

6. The prober according to one of claim 1, further comprising a fourth wire that connects the frame ground terminal and a ground terminal of a test-head housing.

7. The prober according to one of claim 1, wherein a distance between a surface of the chuck stage and a portion through which noise of the prober flows, the portion being adjacent to the surface of the chuck stage, is five centimeters or more.

8. The prober according to claim 7, wherein the portion through which the noise of the prober flows comprises at least one of the shielded cable, a housing of the servo motor, a shaft of the servo motor up to the first insulating member, and the servo amplifier.

9. The prober according to claim 8, wherein the one of the at least one servo motor is a motor to which a greatest load is applied.

10. The prober according to one of claim 1, wherein the servo amplifier includes a switching device comprising a flywheel diode with which a silicon carbide diode is connected in parallel.

11. The prober according to one of claim 1, wherein the servo amplifier includes a switching device comprising a silicon carbide diode.

12. A testing apparatus comprising the prober according to claim 1.

13. A prober comprising:
   a frame having a frame ground terminal;
   a chuck stage for placing a device under test;
   at least one servo motor for driving the chuck stage, each servo motor having a ground terminal and a shaft with a first insulating member;
   at least one servo amplifier connected to the servo motor, each servo amplifier having a ground terminal;
   at least one first floating mount on which the at least one servo amplifier is provided, the first floating mount being electrically insulated from the frame and being provided with a first ground terminal that is connected to the ground terminal of the servo amplifier;
   at least one second floating mount on which at least one of the at least one servo motor is provided, each second floating mount being electrically insulated from the frame and being provided with a second ground terminal that is connected to the ground terminal of each of the at least one servo motor;
   a shielded cable that connects the servo amplifier and the servo motor;
   a first wire that connects the first ground terminal and the frame ground terminal and that connects the second floating mount and the frame ground terminal; and
   a second wire that connects the shielded cable and the frame ground terminal.

14. The prober according to claim 13, further comprising an output filter for the at least one servo amplifier, the output filter being provided between the servo amplifier and the servo motor; and a metal connector provided for connection by the shielded cable between the servo amplifier and the servo motor, a shell of each metal connector being connected to a shield of the shielded cable.

15. The prober according to claim 13, further comprising a support member for supporting the chuck stage and a support table for supporting the support member, wherein a shaft of the at least one servo motor is connected to another extension shaft with a second insulating member provided therebetween, and a metal portion of the shaft, the support member, and the support table are connected to the frame ground terminal.

* * * * *